(12) United States Patent
Weng

(10) Patent No.: US 10,700,637 B2
(45) Date of Patent: Jun. 30, 2020

(54) OSCILLATOR CIRCUITS CAPABLE OF COMPENSATING FOR PVT VARIATIONS

(71) Applicant: Winbond Electronics Corp., Taichung (TW)

(72) Inventor: Tzu-Hsiang Weng, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/412,911

(22) Filed: May 15, 2019

(65) Prior Publication Data

US 2019/0356269 A1 Nov. 21, 2019

(30) Foreign Application Priority Data

May 15, 2018 (TW) ............... 107116430 A

(51) Int. Cl.
*H03B 5/04* (2006.01)
*H03K 4/502* (2006.01)
*H03K 5/06* (2006.01)
*H03L 7/18* (2006.01)

(52) U.S. Cl.
CPC .............. *H03B 5/04* (2013.01); *H03K 4/502* (2013.01); *H03K 5/06* (2013.01); *H03L 7/18* (2013.01)

(58) Field of Classification Search
CPC .......... H02M 3/07; H02M 3/073; H02M 1/14; H02M 2003/071; H03L 7/0895; H03L 7/0893; H03L 7/0896; H03L 7/093; H03L 5/00; H03L 7/0898; H03L 7/099; H03L 7/00; H03L 7/07; H03L 7/18; H03K 4/502; H03K 5/06
USPC .................. 331/111, 143, 183, 185; 327/536
See application file for complete search history.

(56) References Cited

U.S. PATENT DOCUMENTS

| | | | |
|---|---|---|---|
| 8,519,879 B1 * | 8/2013 | Denham ................. | H03M 1/60 324/116 |
| 9,325,323 B2 | 4/2016 | Rana et al. | |
| 2008/0129400 A1 | 6/2008 | Celani | |
| 2010/0060343 A1 * | 3/2010 | Saitoh ................... | H02M 3/073 327/536 |
| 2012/0274394 A1 * | 11/2012 | Chan ...................... | G05F 1/625 327/536 |
| 2016/0181913 A1 * | 6/2016 | Feng ....................... | H02M 3/07 327/536 |

* cited by examiner

*Primary Examiner* — Arnold M Kinkead
(74) *Attorney, Agent, or Firm* — Muncy, Gessler, Olds & Lowe, P.C.

(57) ABSTRACT

An oscillator circuit includes a signal generating circuit and a reference voltage generating circuit. The signal generating circuit is configured to receive a reference voltage and generate an output signal according to a comparison result of the reference voltage and a feedback voltage. The feedback voltage is pre-charged to a level of a system high voltage. The reference voltage generating circuit is coupled to the signal generating circuit and configured to generate the reference voltage.

10 Claims, 7 Drawing Sheets

US 10,700,637 B2

OSCILLATOR CIRCUITS CAPABLE OF COMPENSATING FOR PVT VARIATIONS

CROSS REFERENCE TO RELATED APPLICATIONS

This application claims priority of Taiwan Patent Application No. 107116430, filed on May 15, 2018, the entirety of which is incorporated by reference herein.

BACKGROUND OF THE INVENTION

Field of the Invention

The invention relates to an oscillator circuit, and more particularly to an oscillator circuit capable of compensating for PVT variations.

Description of the Related Art

Process, voltage, and temperature (PVT) variations are one of the critical factors that hamper the performance of ICs. For example, PVT variations can result in a change in the oscillating frequency of a clock signal. However, clock generation is an important part of any electronic system. Especially, the performance of circuits driven by the system clock will be further affected by the variation of the clock frequency. For example, the driving ability of a charge pump circuit receiving a clock signal from an oscillator circuit is strong when the oscillating frequency is high, and the driving ability of the charge pump circuit is weak when the oscillating frequency is low.

When the driving ability is insufficient, one approach is to increase the number of charge pump circuits. However, the circuit area is increased accordingly. Another approach is to increase the oscillating frequency of the clock signal. However, this may result in excessively high voltage in the fast corner conditions since the driving ability is overly enhanced.

To avoid the undesired effects of PVT variations, a novel structure of an oscillator circuit capable of compensating for PVT variations is provided.

BRIEF SUMMARY OF THE INVENTION

Oscillator circuits are provided. An exemplary embodiment of an oscillator circuit comprises a signal generating circuit and a reference voltage generating circuit. The signal generating circuit is configured to receive a reference voltage and generate an output signal according to a comparison result of the reference voltage and a feedback voltage. The feedback voltage is pre-charged to a level of a system high voltage. The reference voltage generating circuit is coupled to the signal generating circuit and configured to generate the reference voltage.

An exemplary embodiment of an oscillator circuit comprises a signal generating circuit and a reference voltage generating circuit. The signal generating circuit is configured to receive a reference voltage and generate an output signal according to a comparison result of the reference voltage and a feedback voltage. The signal generating circuit comprises a capacitor. The capacitor is repeatedly charged or discharged in response to a level of the output signal so as to generate the feedback voltage at a terminal. The reference voltage generating circuit is coupled to the signal generating circuit and configured to generate the reference voltage.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
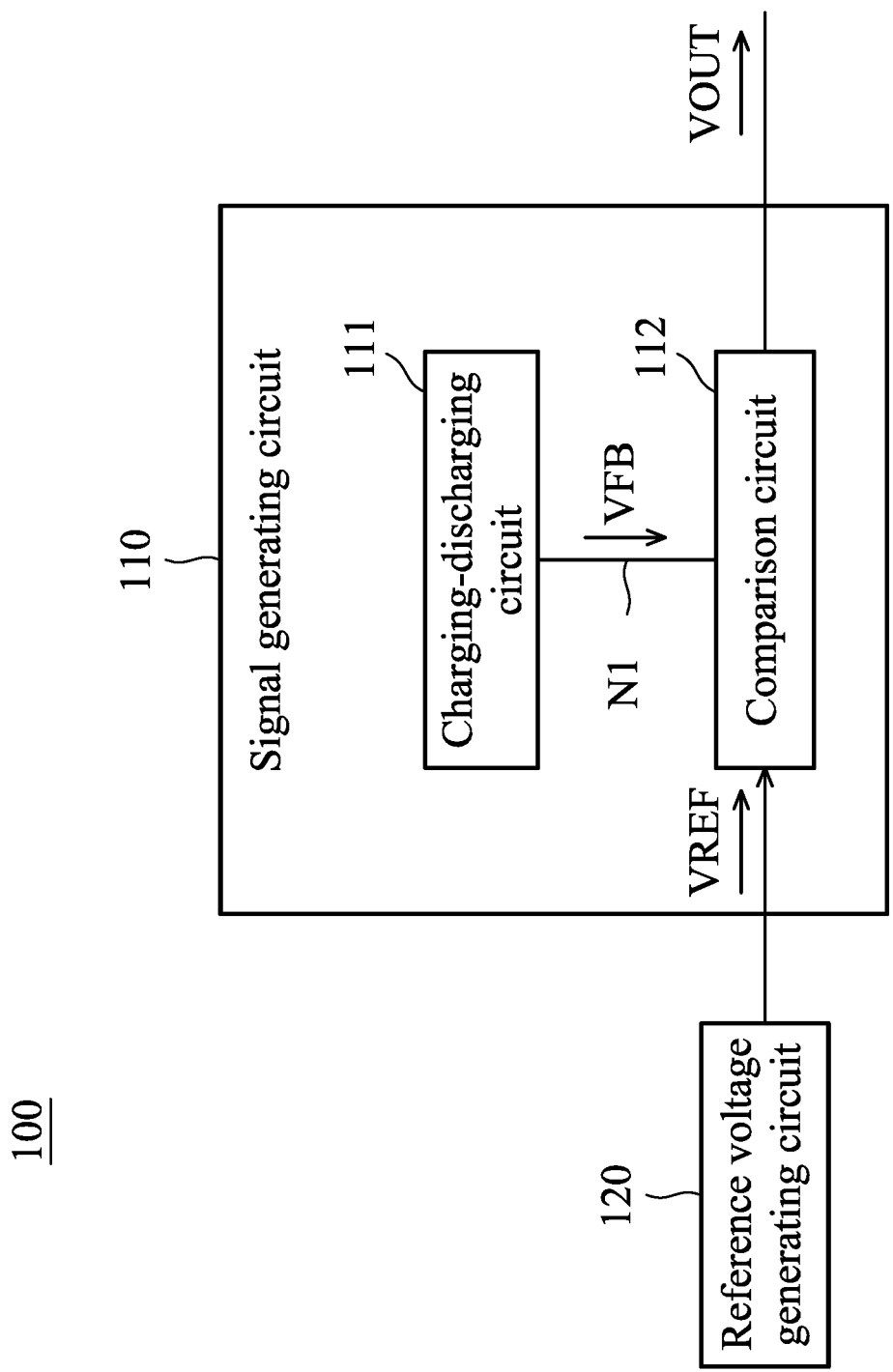
FIG. 1 is an exemplary block diagram of an oscillator circuit according to an embodiment of the invention.

FIG. 1 is an exemplary block diagram of an oscillator circuit according to an embodiment of the invention. The oscillator circuit 100 may comprise a signal generating circuit 110 and a reference voltage generating circuit 120. The reference voltage generating circuit 120 is coupled to the signal generating circuit 110 and is configured to generate a reference voltage VREF. The signal generating circuit 110 is configured to receive the reference voltage VREF and generate an output signal VOUT according to a comparison result of the reference voltage VREF and a feedback voltage VFB. The output signal VOUT may be a clock signal or an oscillating signal which comprises a plurality of pulses, wherein the pulses are repeatedly or periodically generated based on the comparison result, and wherein the period (or the length of the period) of the output signal VOUT is determined or defined by the difference between the time at which the rising/falling edges of two adjacent pulses are generated.

According to an embodiment of the invention, the signal generating circuit 110 may comprise a charging-discharging circuit 111 and a comparison circuit 112. The charging-discharging circuit 111 may be coupled to the comparison circuit 112 at a terminal N1 and may comprise a capacitor (not shown in FIG. 1) coupled to the terminal N1. The charging-discharging circuit 111 is configured to control charging or discharging of the capacitor according to the level of the output signal VOUT, so as to generate the feedback voltage VFB at the terminal N1. The comparison circuit 112 is configured to receive the reference voltage VREF and the feedback voltage VFB, compare levels of the reference voltage VREF and the feedback voltage VFB to generate the comparison result, and generate the output signal VOUT according to the comparison result.

According to an embodiment of the invention, the oscillator circuit 100 may receive the system high voltage VDD and the feedback voltage VFB may be pre-charged to the level of the system high voltage VDD. In this manner, when operation of the oscillator circuit 100 is started, the capacitor will be discharged from the level of the system high voltage VDD. The comparison circuit 112 may keep comparing the levels of the reference voltage VREF and the feedback voltage VFB. When the comparison result is changed, the level of the output signal VOUT is changed as well, thereby generating the pulses of the output signal VOUT. In response to generation of the pulses of the output signal VOUT, the signal generating circuit 110 may further charge the feedback voltage VFB to the system high voltage level so that it can be discharged again from the system high voltage level. Through the reciprocating operations, the feedback voltage VFB can be repeatedly increased or decreased in response to the changes in the level of the output signal VOUT, and thus the pulses of the output signal VOUT can be sequentially generated. Because the output signal VOUT comprises a plurality of repeatedly or periodically generated pulses, the output signal VOUT may be provided as a fundamental clock signal or oscillating signal for other circuits (as an example, a charge pump circuit).

Figure 2:
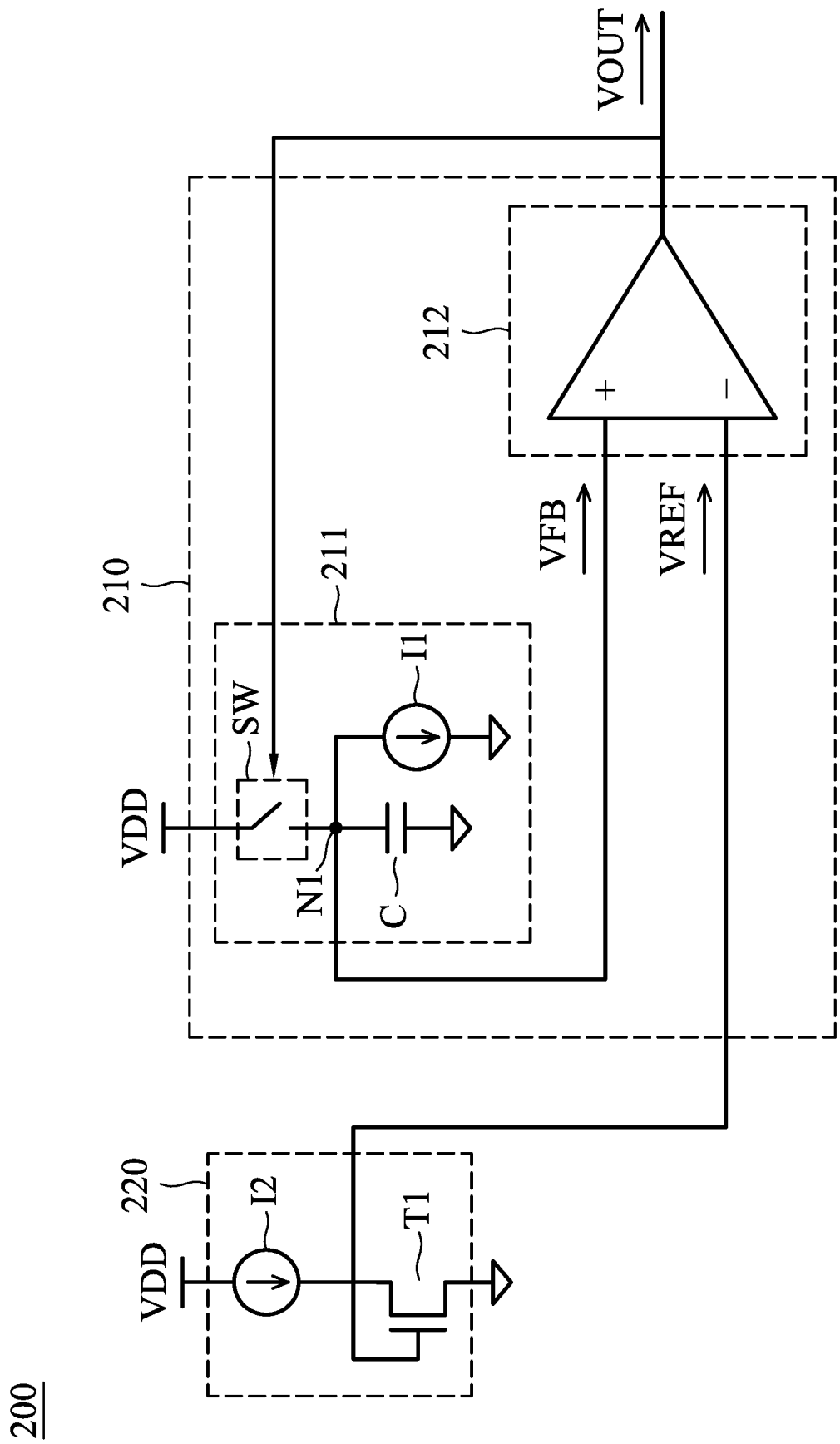
FIG. 2 is an exemplary circuit diagram of an oscillator circuit according to an embodiment of the invention.

FIG. 2 is an exemplary circuit diagram of an oscillator circuit according to an embodiment of the invention. The oscillator circuit 200 may comprise a signal generating circuit 210 and a reference voltage generating circuit 220. The reference voltage generating circuit 220 is coupled to the signal generating circuit 210 and is configured to generate a reference voltage VREF. The signal generating circuit 210 is configured to receive the reference voltage VREF and generate an output signal VOUT according to a comparison result of the reference voltage VREF and a feedback voltage VFB.

According to an embodiment of the invention, the signal generating circuit 210 may comprise a charging-discharging circuit 211 and a comparison circuit 212. The charging-discharging circuit 211 may comprise a capacitor C, a first current source I1 and a switch SW. The capacitor C and the first current source I1 are coupled in parallel between the terminal N1 and a ground node. The switch SW is coupled between a power supplying node for providing the system high voltage VDD and the terminal N1. The open and close (or, off and on) of the switch SW is controlled by the level of the output signal VOUT. The comparison circuit 212 may comprise a comparator. The comparator is configured to receive the reference voltage VREF and the feedback voltage VFB, compare levels of the reference voltage VREF and the feedback voltage VFB so as to generate the comparison result, and generate the output signal VOUT according to the comparison result.

According to an embodiment of the invention, the switch SW may be closed (that is, turned on) in advance for pre-charging the capacitor C, such that the feedback voltage VFB is pre-charged to the level of the system high voltage VDD. Meanwhile, the level of the feedback voltage VFB is higher than the level of the reference voltage VREF. When the operation of the oscillator circuit 200 is started, the switch SW is opened (that is, turned off), such that the capacitor C begins to be discharged via the first current source I1. As the capacitor C being discharged, the level of the feedback voltage VFB decreases. The feedback voltage VFB keeps decreasing until the level of the feedback voltage VFB becomes lower than the level of the reference voltage VREF. Meanwhile, the comparison result of the comparator is changed as well, thereby changing the level of the output signal VOUT.

In response to the change in the level of the output signal VOUT, the switch SW is closed again to form a short circuit between the power supplying node for providing the system high voltage VDD and the terminal N1. In this manner, the feedback voltage VFB at the terminal N1 will be charged to the level of the system high voltage VDD, again. When the feedback voltage VFB rises to a voltage level higher than the reference voltage VREF, the comparison result is changed again, thereby changing the level of the output signal VOUT, so that the switch SW is opened again and the capacitor C begins to discharge via the first current source I1. Through the reciprocating operations, the capacitor C can be repeatedly charged or discharged in response to the changes in the level of the output signal VOUT. In this manner, the level of the feedback voltage VFB increases and decreases repeatedly, and the level of the feedback voltage VFB is changed between the level of the system high voltage VDD and the level of the reference voltage VREF repeatedly, such that the pulses of the output signal VOUT can be sequentially generated by the comparator.

According to an embodiment of the invention, the switch SW may be implemented by one or more transistors, wherein the transistor(s) may comprise a control gate or a control terminal to receive the output signal VOUT.

Figure 3:
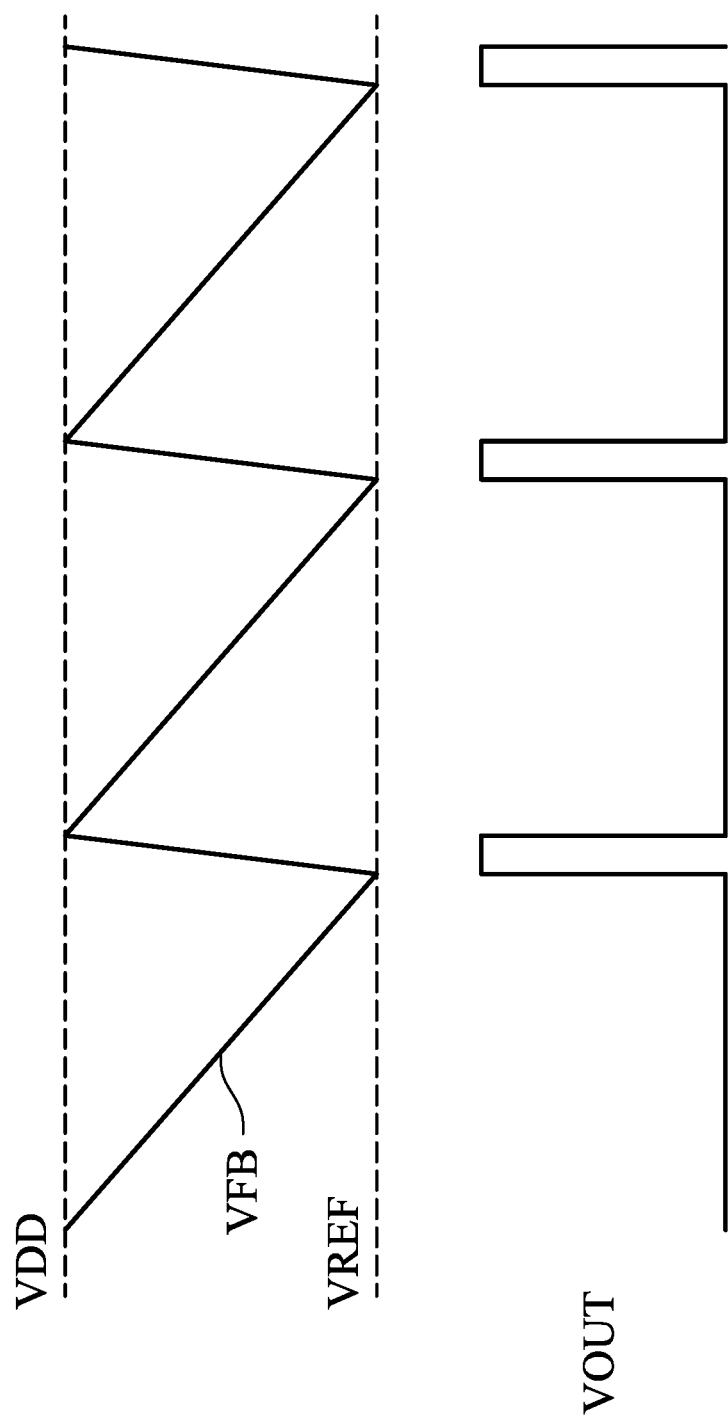
FIG. 3 shows exemplary waveforms of the output signal VOUT and the feedback voltage VFB according to an embodiment of the invention.

FIG. 3 shoves exemplary waveforms of the output signal VOUT and the feedback voltage VFB according to an embodiment of the invention. As shown in FIG. 3, the level of the feedback voltage VFB is changed between the level of the system high voltage VDD and the level of the reference voltage VREF, repeatedly. In addition, when the feedback voltage VFB is greater than or equal to the reference voltage VREF, the output signal VOUT has a low voltage level. When the feedback voltage VFB is lower than the reference voltage VREF, the output signal VOUT is pulled high to have a high voltage level until the condition that the feedback voltage VFB is not lower than the reference voltage VREF has been detected. When the feedback voltage VFB becomes not lower than the reference voltage VREF, the output signal VOUT is pulled low to the low voltage level, thereby generating the output pulses.

When the output signal VOUT has a low voltage level, the switch SW is opened to generate an open circuit, such that the capacitor C begins to be discharged via the first current source I1. When the output signal VOUT has a high voltage level, the switch SW is closed to generate a short circuit, such that the feedback voltage VFB at the terminal N1 is charged to the level of the system high voltage VDD.

According to an embodiment of the invention, the length of the period of the output signal VOUT varies with changes in the level of the system high voltage VDD. As an example, when the level of the system high voltage is increased, since the time required for the feedback voltage VFB to be charged to the level of the system high voltage and the time required for the feedback voltage VFB to be discharged to the level of the reference voltage VREF are increased as well, the length of the period of the output signal VOUT will be lengthened. Similarly, when the level of the system high voltage is decreased, the length of the period of the output signal VOUT will be shortened as well.

In this manner, the effect on the oscillating frequency/period due to the voltage variation of the system high voltage VDD can be compensated for. For example, in the fast corner case where the system high voltage VDD is relatively high and the threshold voltage Vth of the transistor is relatively low, the oscillating frequency is fast and the period is short. However, via the circuit design as discussed above, when the system high voltage is increased, the period of the output signal VOUT will be lengthened as well, so as to compensate for the effect on the oscillating frequency/period due to the voltage variation of the system high voltage VDD. Similarly, in the slow corner case where the system high voltage VDD is relatively low and the threshold voltage Vth of the transistor is relatively high, via the circuit design as discussed above, when the level of the system high voltage is decreased, the period of the output signal VOUT will be shortened and the oscillating frequency/period will be increased as well.

In addition, according to an embodiment of the invention, the length of the period of the output signal VOUT also varies with changes in the level of the reference voltage VREF. As an example, when the level of the reference voltage VREF is increased, since the time required for the feedback voltage VFB to be discharged to the level of the reference voltage VREF is decreased, the length of the period of the output signal VOUT will be shortened as well. Similarly, when the level of the reference voltage VREF is decreased, the length of the period of the output signal VOUT will be lengthened as well. Therefore, by adequately controlling the level of the reference voltage VREF, for example, making it positively related to the threshold voltage Vth of the transistor(s), the effect on the oscillating frequency/period due to the process or temperature variation can be compensated for.

According to an embodiment of the invention, the reference voltage generating circuit 120/220 may comprise a transistor, and the level of the reference voltage VREF may be designed to be positively related to the threshold voltage Vth of the transistor. That is, the level of the reference voltage VREF may be increased/decreased as the threshold voltage Vth is increased/decreased.

Referring back to FIG. 2, according to an embodiment of the invention, the reference voltage generating circuit 220 may comprise a second current source 12 and a diode-connected transistor T1, such as a MOSTET. The drain of the transistor T1 is connected to the gate of the transistor T1. The second current source 12 and the transistor T1 are coupled in serial between the power supplying node of the system high voltage VDD and the ground node, and the drain of the transistor T1 is coupled to the comparison circuit 212, so as to provide the reference voltage VREF. Since the transistor T1 is a diode-connected transistor, the voltage change at the drain of the transistor T1 can reflect the change in the threshold voltage Vth of the transistor T1. Therefore, the level of the reference voltage VREF is positively related to the threshold voltage Vth of the transistor T1, and it varies as the threshold Vth changes.

In this embodiment, the reference voltage VREF is substantially equal to the threshold voltage Vth. In this manner, the effect on the oscillating frequency/period of the output signal VOUT due to the change (by the process or the temperature variation) in the threshold voltage Vth can be compensated for. For example, in the fast corner case where the system high voltage VDD is relatively high and the threshold voltage Vth of the transistor is relatively low, the oscillating frequency is fast and the period is short. However, via the circuit design as discussed above, when the threshold voltage Vth is decreased, the length of the period of the output signal VOUT will be lengthened accordingly, so as to compensate for the effect on the oscillating frequency/period due to the voltage variation of the system high voltage VDD. Similarly, in the slow corner case where the system high voltage VDD is relatively low and the threshold voltage Vth of the transistor is relatively high, via the circuit design as discussed above, the length of the period of the output signal VOUT will be shortened and the oscillating frequency/period will be increased.

It should be noted that although the transistor T1 shown in FIG. 2 is a NMOS transistor, the invention should not be limited thereto.

Figure 4:
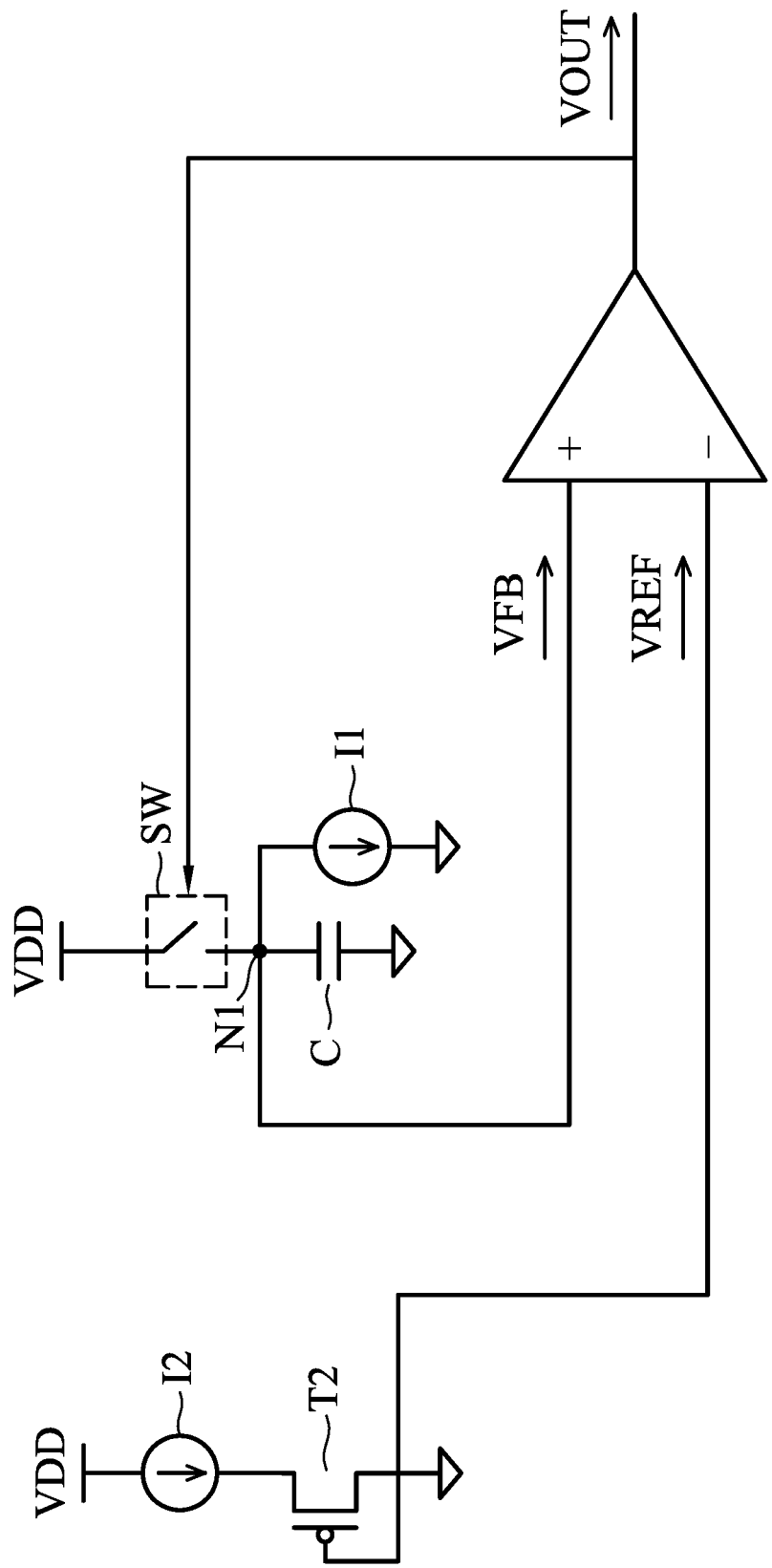
FIG. 4 is an exemplary circuit diagram of an oscillator circuit according to another embodiment of the invention.

FIG. 4 is an exemplary circuit diagram of an oscillator circuit according to another embodiment of the invention. Most of the components in the oscillator circuit 400 are the same as that in the oscillator circuit 200, and the operations thereof are similar to each other. Therefore, reference may be made to the descriptions of FIG. 2, and are omitted here for brevity. The oscillator circuit 400 may comprise a diode-connected transistor T2, where the transistor T2 is a PMOS transistor, and the drain of the transistor T2 is connected to the gate of the transistor T2. Similarly, in this embodiment, the reference voltage VREF is positively related to or substantially equal to the threshold voltage Vth of the transistor T2. In this manner, the effect on the oscillating frequency/period of the output signal VOUT due to the change (by the process or the temperature variation) in the threshold voltage Vth can be compensated for. In addition, the effect on the oscillating frequency/period of the output signal VOUT due to the change in the system high voltage VDD can also be compensated for.

Figure 5:
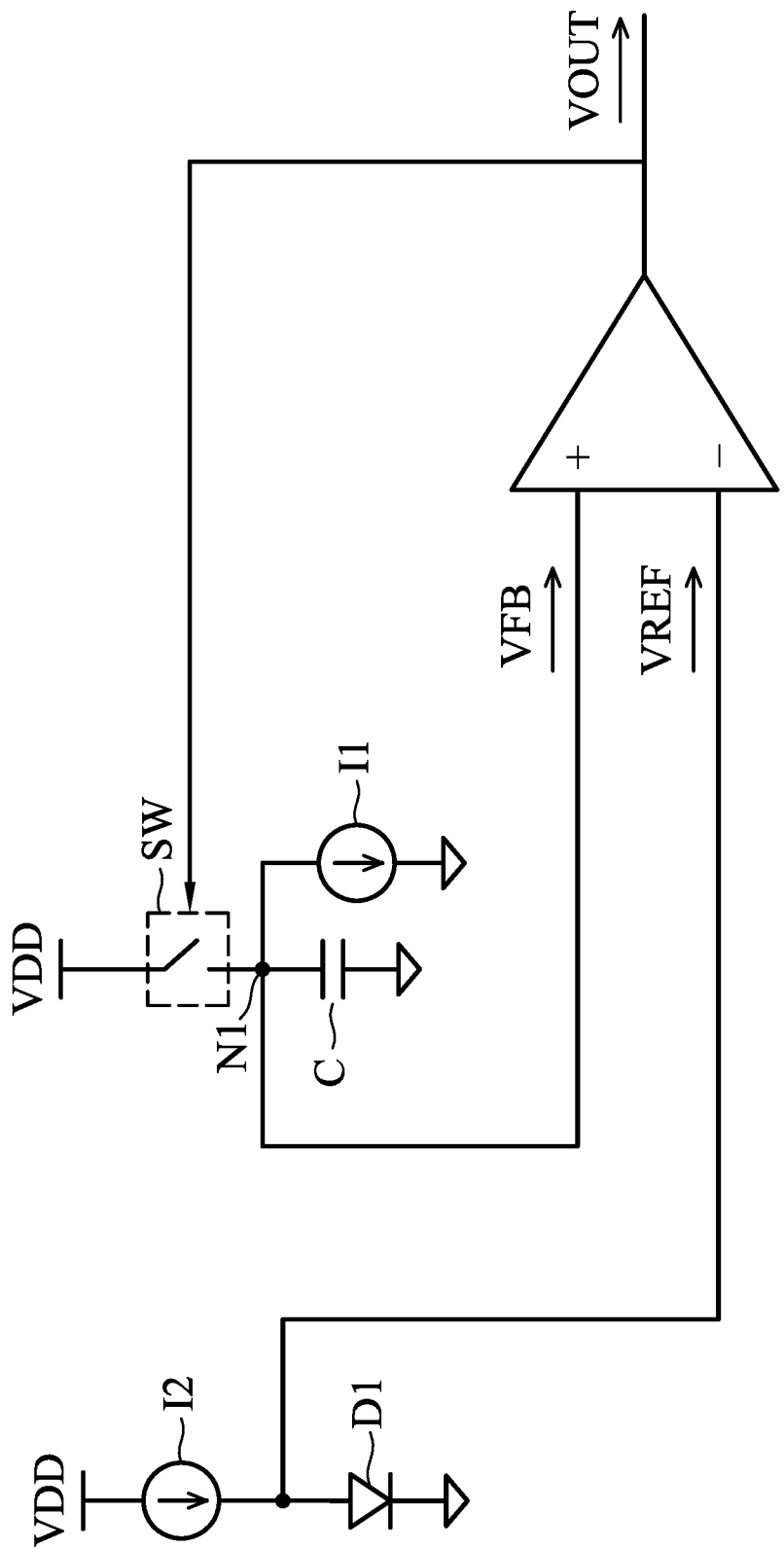
FIG. 5 is an exemplary circuit diagram of an oscillator circuit according to yet another embodiment of the invention.

FIG. 5 is an exemplary circuit diagram of an oscillator circuit according to yet another embodiment of the invention. Most of the components in the oscillator circuit 500 are the same as that in the oscillator circuit 200, and the operations thereof are similar to each other. Therefore, reference may be made to the descriptions of FIG. 2, and are omitted here for brevity. The oscillator circuit 500 may comprise a diode D1. Similarly, in this embodiment, the reference voltage VREF is positively related to or substantially equal to the cut-in voltage of the diode D1. In this manner, the effect on the oscillating frequency/period of the output signal VOUT due to the change (by the process or the temperature variation) in the threshold voltage Vth can be compensated for. In addition, the effect on the oscillating frequency/period of the output signal VOUT due to the change in the system high voltage VDD can also be compensated for.

Figure 6:
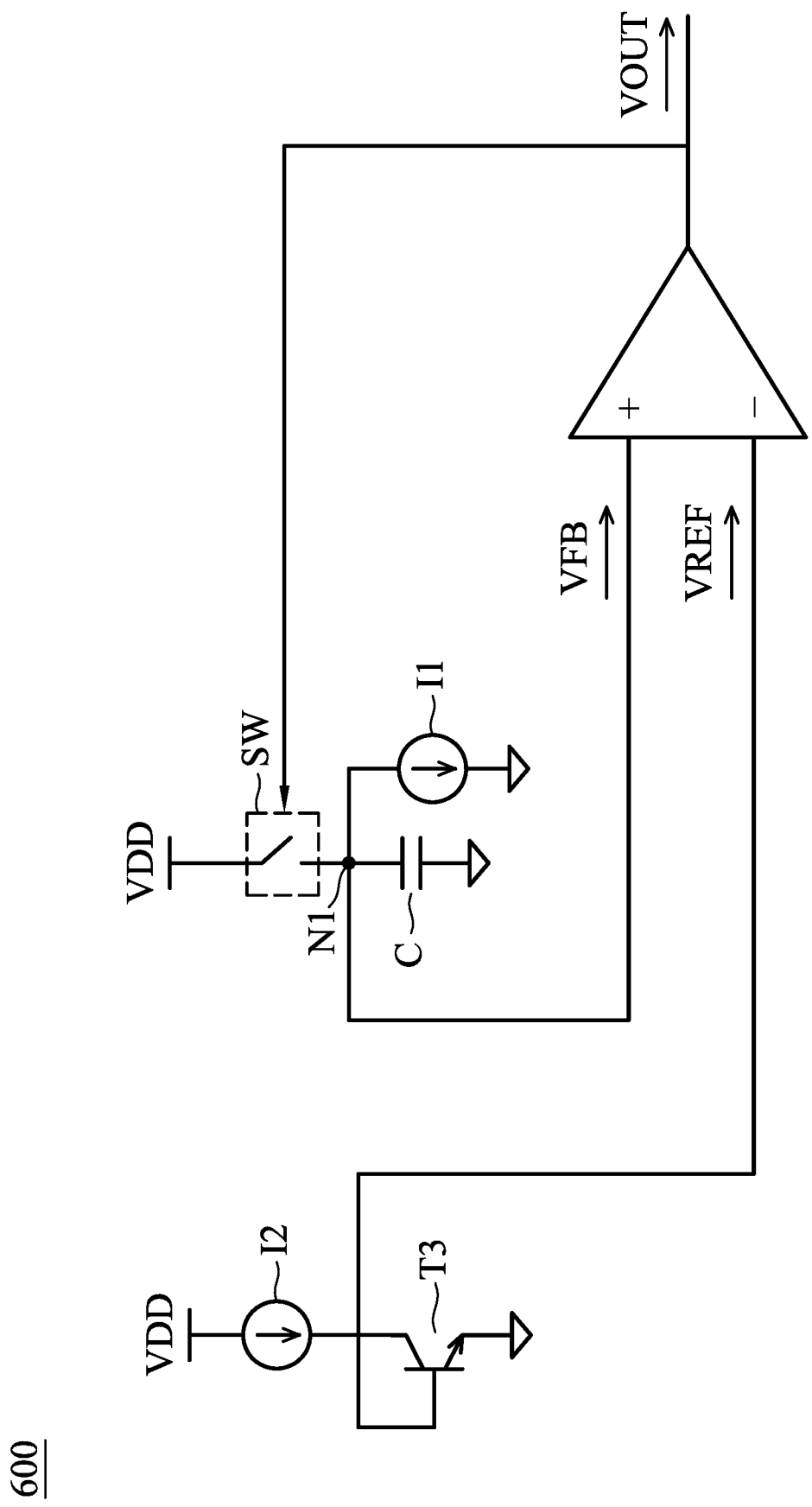
FIG. 6 is an exemplary circuit diagram of an oscillator circuit according to yet another embodiment of the invention.

FIG. 6 is an exemplary circuit diagram of an oscillator circuit according to yet another embodiment of the invention. Most of the components in the oscillator circuit 600 are the same as that in the oscillator circuit 200, and the operations thereof are similar to each other. Therefore, reference may be made to the descriptions of FIG. 2, and are omitted here for brevity. The oscillator circuit 500 may comprise a diode-connected transistor T3, where the transistor T3 is an npn type bipolar junction transistor (BJT), and the collector of the transistor T3 is connected to the base of the transistor T3. Similarly, in this embodiment, the reference voltage VREF is positively related to or substantially equal to the base-emitter voltage VBE of the transistor T3. In this manner, the effect on the oscillating frequency/period of the output signal VOUT due to the change (by the process or the temperature variation) in the base-emitter voltage VBE can be compensated for. In addition, the effect on the oscillating frequency/period of the output signal VOUT due to the change in the system high voltage VDD can also be compensated for.

Figure 7:
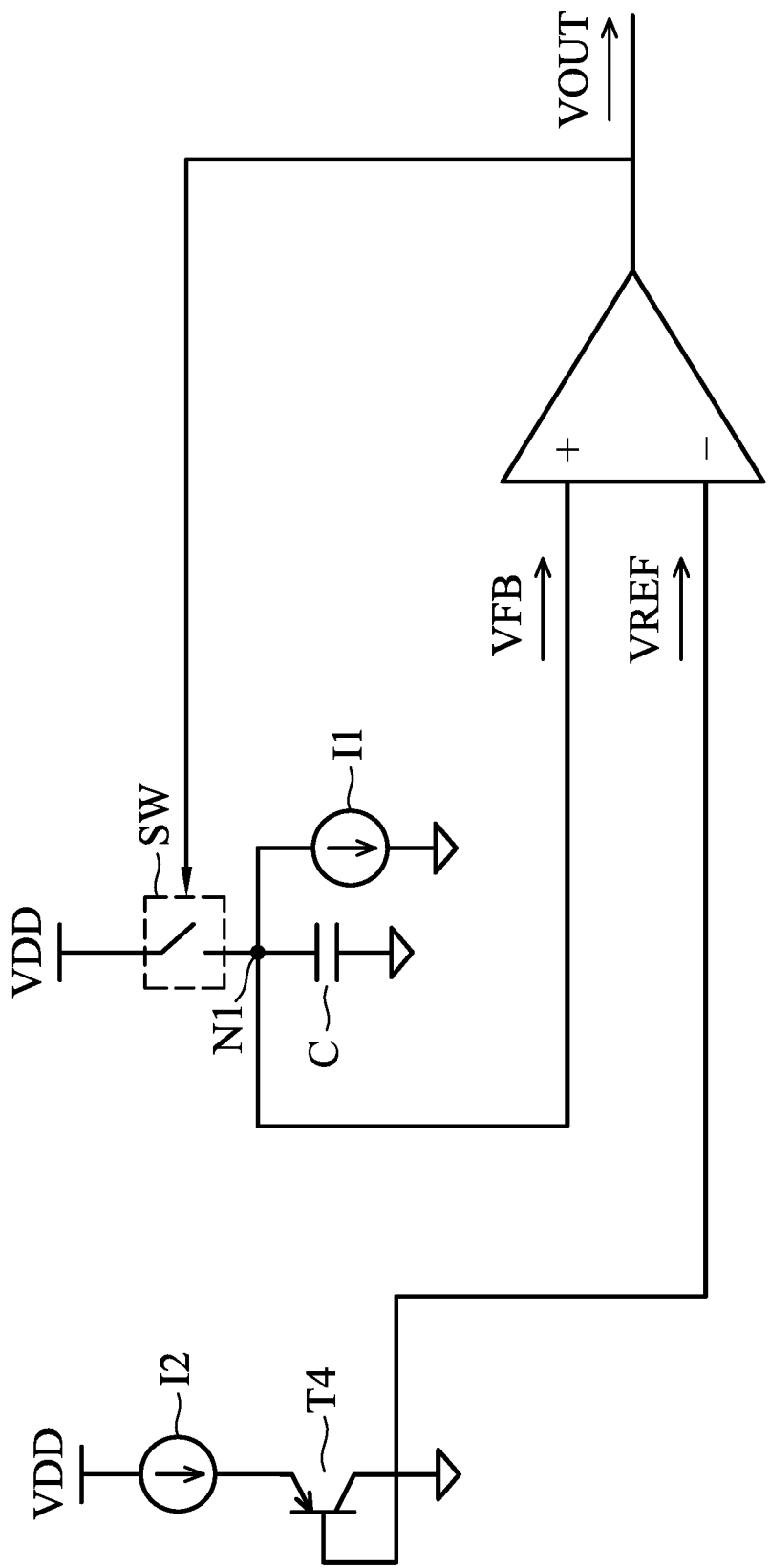
FIG. 7 is an exemplary circuit diagram of an oscillator circuit according to yet another embodiment of the invention.

FIG. 7 is an exemplary circuit diagram of an oscillator circuit according to yet another embodiment of the invention. Most of the components in the oscillator circuit 700 are the same as that in the oscillator circuit 200, and the operations thereof are similar to each other. Therefore, reference may be made to the descriptions of FIG. 2, and are omitted here for brevity. The oscillator circuit 700 may comprise a diode-connected transistor T4, where the transistor T4 is a pnp type bipolar junction transistor (BJT), and the collector of the transistor T4 is connected to the base of the transistor T4. Similarly, in this embodiment, the reference voltage VREF is positively related to or substantially equal to the emitter-base voltage VEB of the transistor T4. In this manner, the effect on the oscillating frequency/period of the output signal VOUT due to the change (by the process or the temperature variation) in the emitter-base voltage VEB can be compensated for. In addition, the effect on the oscillating frequency/period of the output signal VOUT due to the change in the system high voltage VDD can also be compensated for.

Unlike the existing oscillator circuit technology, which cannot effectively compensate for the effect on the frequency/period of the output signal VOUT caused due to the process, voltage or temperature variation, in proposed the oscillator circuit, the frequency/period of the output signal can be adaptively adjusted in response to the PVT variations. In this manner, the effect on the oscillating frequency/period due to the PVT variations can be compensated for, and the problems of the existing technology can be solved.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An oscillator circuit, comprising:
a signal generating circuit, configured to receive a reference voltage and generate an output signal according to a comparison result of the reference voltage and a feedback voltage, wherein the feedback voltage is pre-charged to a level of a system high voltage; and
a reference voltage generating circuit, coupled to the signal generating circuit and configured to generate the reference voltage,
wherein the output signal is a clock signal comprising a plurality of pulses, and wherein a length of a period of the output signal varies with changes in the level of the system high voltage or a level of the reference voltage.

2. The oscillator circuit as claimed in claim 1, wherein a level of the feedback voltage is repeatedly changed between the level of the system high voltage and the level of the reference voltage.

3. The oscillator circuit as claimed in claim 1, wherein the reference voltage generating circuit comprises a transistor, and wherein a level of the reference voltage is positively related to a threshold voltage of the transistor.

4. The oscillator circuit as claimed in claim 1, wherein the signal generating circuit comprises:
a comparison circuit, configured to receive the reference voltage and the feedback voltage, compare levels of the reference voltage and the feedback voltage to generate the comparison result, and generate the output signal according to the comparison result; and
a charging-discharging circuit, coupled to the comparison circuit at a terminal and configured to receive the output signal, wherein the charging-discharging circuit comprises:
a capacitor, coupled to the terminal,
wherein the charging-discharging circuit is further configured to control charging or discharging of the capacitor according to a level of the output signal to generate the feedback voltage at the terminal.

5. The oscillator circuit as claimed in claim 4, wherein the charging-discharging circuit further comprises:
a current source, wherein the current source and the capacitor are coupled in parallel between the terminal and a ground node.

6. An oscillator circuit, comprising:
a signal generating circuit, configured to receive a reference voltage and generate an output signal according to a comparison result of the reference voltage and a feedback voltage, wherein the signal generating circuit comprises a capacitor, the capacitor is repeatedly charged or discharged in response to a level of the output signal so as to generate the feedback voltage at a terminal; and
a reference voltage generating circuit, coupled to the signal generating circuit and configured to generate the reference voltage, wherein a level of the feedback voltage is repeatedly changed between a level of a system high voltage and a level of the reference voltage,
wherein the output signal is a clock signal comprising a plurality of pulses, and wherein a length of a period of the output signal varies with changes in the level of the system high voltage or the level of the reference voltage.

7. The oscillator circuit as claimed in claim 6, wherein the reference voltage generating circuit comprises a transistor, and wherein a level of the reference voltage is positively related to a threshold voltage of the transistor.

8. The oscillator circuit as claimed in claim 6, wherein when the level of the system high voltage is increased, the length of the period of the output signal is lengthened accordingly.

9. The oscillator circuit as claimed in claim 8, wherein when the level of the reference voltage is decreased, the length of the period of the output signal is lengthened accordingly.

10. The oscillator circuit as claimed in claim 7, wherein when a level of the threshold voltage is decreased, a length of a period of the output signal is lengthened accordingly.

* * * * *